(12) United States Patent
Ariyoshi et al.

(10) Patent No.: US 9,269,781 B2
(45) Date of Patent: Feb. 23, 2016

(54) SEMICONDUCTOR DEVICE AND METHOD FOR MANUFACTURING THE SAME (71) Applicant: Kabushiki Kaisha Toshiba, Minato-ku (JP)

(72) Inventors: Keiko Ariyoshi, Okayama-ken (JP); Takuma Suzuki, Kanagawa-ken (JP); Takashi Shinohe, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/557,864

(22) Filed: Dec. 2, 2014

(65) Prior Publication Data
US 2015/0087124 A1 Mar. 26, 2015

Related U.S. Application Data (62) Division of application No. 13/715,204, filed on Dec. 14, 2012, now Pat. No. 8,941,120.

(30) Foreign Application Priority Data

Mar. 26, 2012 (JP) .................. 2012-069072

(51) Int. Cl.
*H01L 29/15* (2006.01)
*H01L 21/20* (2006.01)
(Continued)

(52) U.S. Cl.
CPC .......... *H01L 29/4236* (2013.01); *H01L 21/049* (2013.01); *H01L 29/1608* (2013.01);
(Continued)

(58) Field of Classification Search
CPC .................. H01L 21/02167; H01L 21/02378; H01L 21/02447; H01L 21/02529; H01L 29/1608; H01L 21/3148
USPC .............. 257/77, 78, 289, 295, 331, 341, 410
See application file for complete search history.

(56) References Cited

U.S. PATENT DOCUMENTS

| 5,742,076 A | 4/1998 | Sridevan et al. |
| 2009/0114969 A1* | 5/2009 | Suzuki et al. .................. 257/301 |

(Continued)

FOREIGN PATENT DOCUMENTS

| JP | 2000-106428 | 4/2000 |
| JP | 2003-158262 | 5/2003 |

(Continued)

OTHER PUBLICATIONS

Office Action issued May 2, 2014 in Japanese Patent Application No. 2012-069072 (w/English translation).

(Continued)

*Primary Examiner* — Selim Ahmed
*Assistant Examiner* — Moin Rahman
(74) *Attorney, Agent, or Firm* — Oblon, McClelland, Maier & Neustadt, L.L.P.

(57) ABSTRACT

According to one embodiment, a semiconductor device includes a first, a second, a third, a fourth semiconductor region, a control electrode, and an insulating film. The first region contains silicon carbide. The second region is provided on the first region and contains silicon carbide. The third region is provided on the second region and contains silicon carbide. The fourth region is provided on the third region and contains silicon carbide. The control electrode is provided in a trench. The trench is formed in the fourth, the third, and the second semiconductor region. The insulating film is provided between a side surface of the trench and the control electrode. The insulating film contains a high-dielectric constant region. The high-dielectric constant region contacts with at least the third semiconductor region. The high-dielectric constant region has a higher dielectric constant than a dielectric constant of silicon oxide.

9 Claims, 10 Drawing Sheets

(51) Int. Cl.
　　*H01L 29/423*　　(2006.01)
　　*H01L 29/16*　　(2006.01)
　　*H01L 29/66*　　(2006.01)
　　*H01L 29/78*　　(2006.01)
　　*H01L 21/04*　　(2006.01)
　　*H01L 29/49*　　(2006.01)
　　*H01L 29/51*　　(2006.01)

(52) U.S. Cl.
　　CPC ........ *H01L29/517* (2013.01); *H01L 29/66068* (2013.01); *H01L 29/66348* (2013.01); *H01L 29/66666* (2013.01); *H01L 29/66734* (2013.01); *H01L 29/7813* (2013.01); *H01L 29/7827* (2013.01); *H01L 29/42368* (2013.01); *H01L 29/4925* (2013.01); *H01L 29/4975* (2013.01); *H01L 29/512* (2013.01)

(56) References Cited

U.S. PATENT DOCUMENTS

| | | | |
|---|---|---|---|
| 2010/0193796 A1* | 8/2010 | Nakano | H01L 29/45 257/66 |
| 2011/0186927 A1* | 8/2011 | Kawaguchi et al. | 257/342 |
| 2013/0285069 A1 | 10/2013 | Yano et al. | |

FOREIGN PATENT DOCUMENTS

| | | |
|---|---|---|
| JP | 2011-159763 | 8/2011 |
| JP | 2012-23291 | 2/2012 |
| WO | 2011/027831 A1 | 3/2011 |
| WO | WO 2012/026089 A1 | 3/2012 |

OTHER PUBLICATIONS

Office Action issued Nov. 13, 2015 in Japanese Patent Application 2014-211223 (with English language translation).

* cited by examiner

SEMICONDUCTOR DEVICE AND METHOD FOR MANUFACTURING THE SAME

CROSS-REFERENCE TO RELATED APPLICATION

This application is a division of and claims the benefit of priority under 35 U.S.C. §120 from U.S. Ser. No. 13/715,204 filed Dec. 14, 2012, and claims the benefit of priority under 35 U.S.C. §119 from Japanese Patent Application No. 2012-069072 filed Mar. 26, 2012; the entire contents of each of which are incorporated herein by reference.

FIELD

Embodiments described herein relate generally to a semiconductor device and a method for manufacturing the same.

BACKGROUND

As compared to silicon (Si), silicon carbide (SiC) has excellent physical properties; it has three times as large as a band gap, about 10 times as large as a breakdown field strength, and about three times as large as a heat conductivity. By utilizing those properties, it is possible to realize a low-loss semiconductor device excellent in high-temperature performance.

Such semiconductor devices utilizing those SiC properties may include metal oxide semiconductor field effect transistors (MOSFETs) and insulated gate bipolar transistors (IGBTs). Among those device structures, a gate-electrode having a trench-type structure has merits for finer patterning and higher integration densities than the planar type, being expected to further lower the turn-on resistance.

The properties of the gate insulating film provide one of the main important factors that determine the performance and reliabilities of the semiconductor devices. Especially in the trench type semiconductor device, a high electric field is applied to an insulating film on the bottom portion of the trench, it is important to maintain its reliabilities. The properties of the gate insulating film formed on the side surface of the trench have a great influence on power driving force of the semiconductor device.

DETAILED DESCRIPTION

In general, according to one embodiment, a semiconductor device includes a first semiconductor region, a second semiconductor region, a third semiconductor region, a fourth semiconductor region, a control electrode, and an insulating film. The first semiconductor region contains silicon carbide. The second semiconductor region is provided on the first semiconductor region and contains silicon carbide of a first conductivity type. The third semiconductor region is provided on the second semiconductor region and contains silicon carbide of a second conductivity type. The fourth semiconductor region is provided on the third semiconductor region and contains silicon carbide of the first conductivity type. The control electrode is provided in a trench. The trench is formed in the fourth semiconductor region, the third semiconductor region, and the second semiconductor region. The insulating film is provided between a side surface of the trench and the control electrode. The insulating film contains a high-dielectric constant region. The high-dielectric constant region contacts with at least the third semiconductor region. The high-dielectric constant region has a higher dielectric constant than a dielectric constant of silicon oxide.

Various embodiments will be described hereinafter with reference to the accompanying drawings.

The drawings are schematic or conceptual, so that the relationship between thickness and width of each of the components and the size ratio between the components are not always realistic. Even the same component may be denoted with different sizes or ratios in the different drawings.

In the specification and the drawings, identical reference numerals are given to identical components in examples, and detailed description on the identical components will be omitted appropriately.

In the following description, as one example, a specific example is given in which a first conductivity type is assumed to be an n type and a second conductivity type is assumed to be a p type.

Further, in the following description, the notations of $n^+$, n, and $n^-$ as well as $p^+$, p, and $p^-$ denote relative levels in impurity concentration of those conductivity types. That is, "$n^+$" denotes a relatively higher impurity concentration than "n" and "$n^-$" denotes a relatively lower impurity concentration than "n". Further, "$p^+$" denotes a relatively higher impurity concentration than "p" and "$p^-$" denotes a relatively lower impurity concentration than "p".

Further, in the following description, a (0001) plane, a (000-1) plane and a (11-20) plane are assumed to respectively include all equivalent planes crystallographically.

First Embodiment

Figure 1:
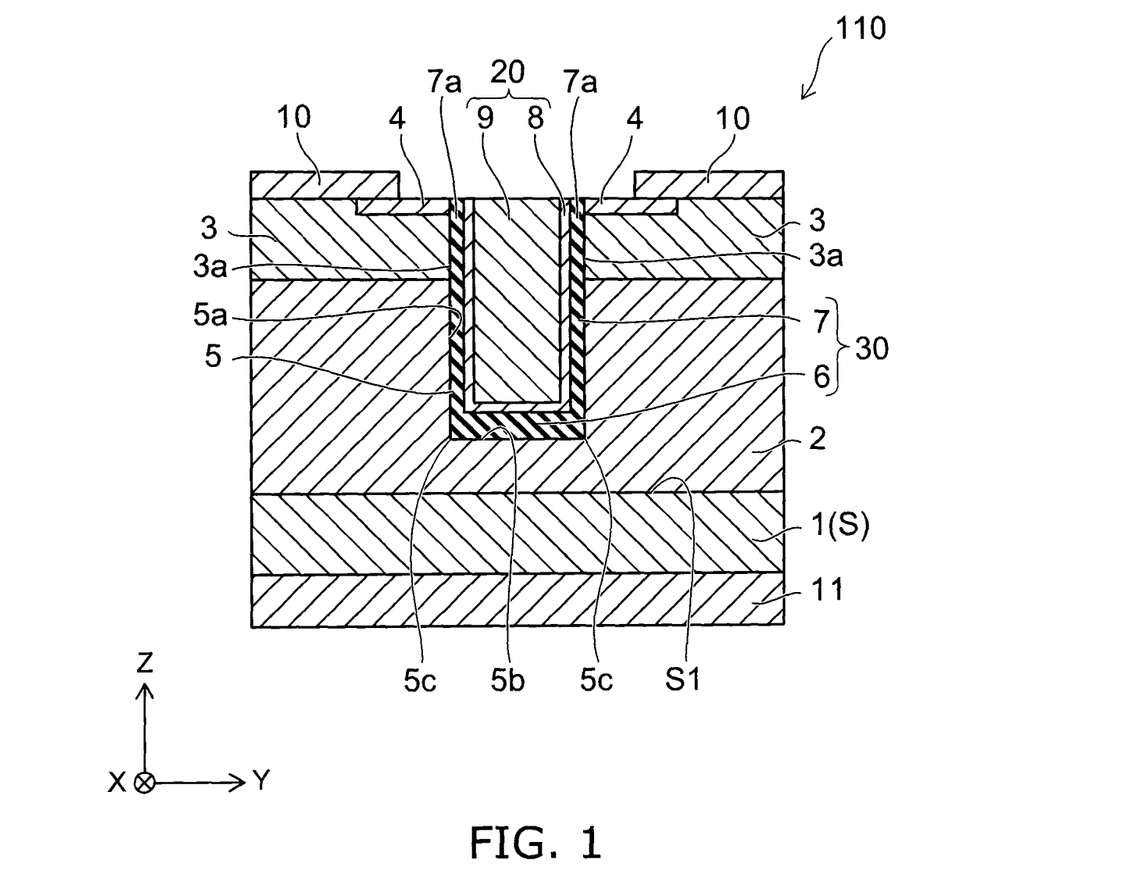
FIG. 1 is a schematic cross-sectional view illustrating a configuration of a semiconductor device according to a first embodiment.

FIG. 1 is a schematic cross-sectional view illustrating a configuration of a semiconductor device according to a first embodiment.

As shown in FIG. 1, a semiconductor device 110 according to the embodiment includes a first semiconductor region 1, a second semiconductor region 2, a third semiconductor region 3, a fourth semiconductor region 4, a control electrode 20, and an insulating film 30. The semiconductor device 110 is an MOSFET containing SiC.

The first semiconductor region 1 contains SiC of a first conductivity type ($n^+$ type). The first semiconductor region 1 is formed, for example, on a substrate S containing, for example, first conductivity type ($n^+$ type) SiC. The first semiconductor region 1 is, for example, a drain region of the MOSFET.

The second semiconductor region 2 is provided on the first semiconductor region 1. The second semiconductor region 2 contains first conductivity type ($n^-$ type) SiC. The second semiconductor region 2 is formed on an upper surface S1 of the substrate S by, for example, epitaxial growth. The second semiconductor region 2 is a drift region of the MOSFET.

In the embodiment, it is assumed that a direction orthogonal to the upper surface S1 of the substrate S is referred to as a Z direction, one of directions orthogonal to the Z direction is referred to as an X direction, and a direction orthogonal to the Z and X directions is referred to as a Y direction. Further, it is assumed that a direction toward the second semiconductor region 2 from the substrate S is referred to as an upward direction and a direction toward the substrate S from the second semiconductor region 2 is referred to as a downward direction (lower side).

The third semiconductor region 3 is provided on the second semiconductor region 2. The third semiconductor region 3 contains SiC of the second conductivity type (p type). The third semiconductor region 3 is a p type base region of the MOSFET.

The fourth semiconductor region 4 is provided on the third semiconductor region 3. The fourth semiconductor region 4 contains SiC of the first conductivity type ($n^+$ type). The fourth semiconductor region 4 is, for example, a source region of the MOSFET.

The control electrode 20 is provided in a trench 5 formed in the fourth semiconductor region 4, the third semiconductor region 3, and the second semiconductor region 2. The trench 5 is formed through the fourth semiconductor region and the third semiconductor region 3 in the Z direction to somewhere halfway to through the second semiconductor region 2. The control electrode 20 is embedded in the trench 5. The control electrode 20 is a gate electrode of the MOSFET. The control electrode 20 includes a first control electrode portion 8 and a second control electrode portion 9 which are described later.

The insulating film 30 is provided between surfaces (side surface 5a and bottom surface 5b) of the trench 5 and the control electrode 20. The insulating film 30 includes a gate insulating film 7 provided between the side surface 5a of the trench 5 and the control electrode 20 and a bottom portion insulating film 6 provided between the bottom surface 5b of the trench 5 and the control electrode 20. The gate insulating film 7 is a gate insulating film of the MOSFET.

In the semiconductor device 110 according to the embodiment, the insulating film 30 is a region of the insulating film 30 which is in contact with at least the third semiconductor region 3 and has a high-dielectric constant region 7a having a higher dielectric constant than a dielectric constant of silicon oxide. The high-dielectric constant region 7a is in contact with a channel formation region (region where a channel of the third semiconductor region 3 is formed) of the gate insulating film 7. For example, the high-dielectric constant region 7a is a region in which a material (referred to as a high-dielectric constant material in the embodiment) exhibiting a higher dielectric constant than a dielectric constant of silicon oxide owing to either one of oxidation and nitridation is diffused into the gate insulating film 7.

Because the high-dielectric constant material is thus diffused into the gate insulating film 7, the effective dielectric constant (for example, Y-directional average of the dielectric constant) of the gate insulating film 7 becomes larger than a case where the gate insulating film 7 is made of only silicon oxide. Thus, the electric capacitance of the gate insulating film 7 increases to improve the current driving force (drain current which occurs when a constant gate voltage is applied) of the semiconductor device 110. Further, the bottom portion insulating film 6 has the high-dielectric constant material less (or not) diffused into it as compared to the gate insulating film 7 and, therefore, is kept as a high quality insulating film having less defects. Thus, reliabilities of the semiconductor device 110 are maintained.

Next, a description will be given of a specific example of the semiconductor device 110 according to the first embodiment.

The substrate S on which the first semiconductor region 1 is formed contains, for example, 4H-SiC. The substrate S is an $n^+$ type substrate containing an n type impurity such as nitrogen (N) at a concentration of about not less than $5\times10^{18}$ cm$^{-3}$ and not more than $1\times10^{19}$ cm$^{-3}$.

The upper surface S1 of the substrate S is a (0001) plane or (000-1) plane. In the embodiment, a case where the upper surface S1 is a (000-1) plane is given as an example. The second semiconductor region 2 formed in the (000-1) plane is an $n^-$ type layer containing an n type impurity at a concentration of about not less than $5\times10^{15}$ cm$^{-3}$ and not more than $1\times10^{17}$ cm$^{-3}$.

In a portion of the surface of the second semiconductor region 2, the third semiconductor region 3 is formed which contains a p type impurity such as Al or B at a concentration of about not less than $1\times10^{17}$ cm$^{-3}$ and not more than $5\times10^{18}$ cm$^{-3}$. In a portion of the surface of the third semiconductor region 3, the $n^+$ type fourth semiconductor region 4 is formed which contains an n type impurity at a concentration of about $1\times10^{20}$ cm$^{-3}$.

Further, the trench 5 is formed from the surface of the fourth semiconductor region 4 through the third semiconductor region 3 to somewhere halfway through the second semiconductor region 2. At least one of the side surfaces 5a of the trench 5 is a (11-20) plane of the substrate S.

In the trench 5, the insulating film 30 (bottom portion insulating film 6 and gate insulating film 7) is formed. In a region which is in contact with the insulating film 30, the first control electrode portion 8 is formed and on the first control electrode portion 8, the second control electrode portion 9 is formed. In the embodiment, on both sides of such a trench structure (the trench 5 as well as the insulating film 30 and the control electrode 20 in trench 5), the fourth semiconductor region 4, the third semiconductor region 3, and the second semiconductor region 2 are provided.

Moreover, in the semiconductor device 110, the first electrode 10 as a source electrode is formed in the fourth semiconductor region 4 and the second electrode 11 as a drain electrode is formed in the first semiconductor region 1.

Next, a description will be given to a method of manufacturing a semiconductor device 110.

FIGS. 2 to 6 are schematic cross-sectional views illustrating the semiconductor device manufacturing method.

Figure 2:
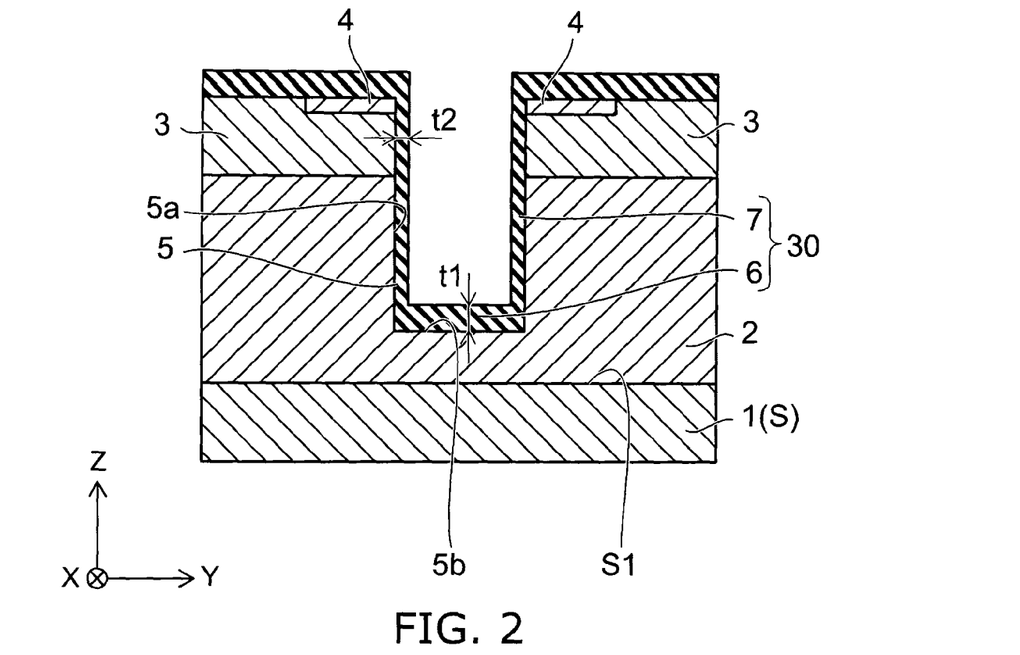
FIGS. 2 to 6 are schematic cross-sectional views illustrating the semiconductor device manufacturing method.

First, as shown in FIG. 2, a low-resistance and 4H-SiC made substrate S is prepared which contains phosphorus or N at a concentration of about $1\times10^{19}$ cm$^{-3}$ as an n type impurity and has a thickness of, for example, 300 micrometers (µm) and a hexagonal crystal-based crystal lattice. The substrate S includes the first semiconductor region 1.

On the (000-1) plane as an upper plane of the SiC-made substrate S, the second semiconductor region 2 is grown which contains, for example, N at an impurity concentration of about $5\times10^{15}$ cm$^{-3}$ as an n type impurity by, for example, epitaxial growth and has a thickness of, for example, 10 µm.

Next, for example, aluminum (Al) ions are implanted as a p type impurity into a surface of the second semiconductor region 2 by using appropriate masks, thereby forming a third semiconductor region 3. Next, for example, N ions are implanted as an n type impurity into a surface of the third semiconductor region 3 by using appropriate masks, thereby forming a fourth semiconductor region 4. Then, heat treatment at a temperature of, for example, about 1600° C. is conducted to activate the impurity.

Next, anisotropic etching is performed to form the trench 5 having a depth which reaches the second semiconductor region 2 via the third semiconductor region 3 from the surface of the fourth semiconductor region 4. At least one of the side surfaces 5a of the trench 5 is a (11-20) plane of the substrate S. After the etching, preferably, heat treatment is conducted to flatten inner surfaces (side surface 5a and bottom surface 5b) of the trench 5. Further, the bottom surface 5b of the trench 5 may be shaped like a curve by performing etching or heat treatment.

Next, as shown in FIG. 2, a $SiO_2$ film having a film thickness of about not less than 30 nanometers (nm) and not more than 100 nm is formed using thermal oxidation, chemical vapor deposition (CVD), or atomic layer deposition (ALD). The $SiO_2$ film provides an insulating film 30. In this case, preferably a film thickness t1 of the $SiO_2$ film (bottom portion insulating film 6) on the bottom portion of the trench 5 is larger than a film thickness t2 of the $SiO_2$ film (gate insulating film 7) on the side surface of the trench 5.

Such $SiO_2$ films having the different film thicknesses in the trench 5 can be realized by utilizing an anisotropic film forming method or utilizing a fact that the oxidization rate is different with the different plane direction in the trench 5. Further, an aluminum oxide film ($Al_2O_3$ film) may be formed in place of the $SiO_2$ film by using CVD, ALD, or physical vapor deposition (PVD) such as sputtering.

Figure 3:
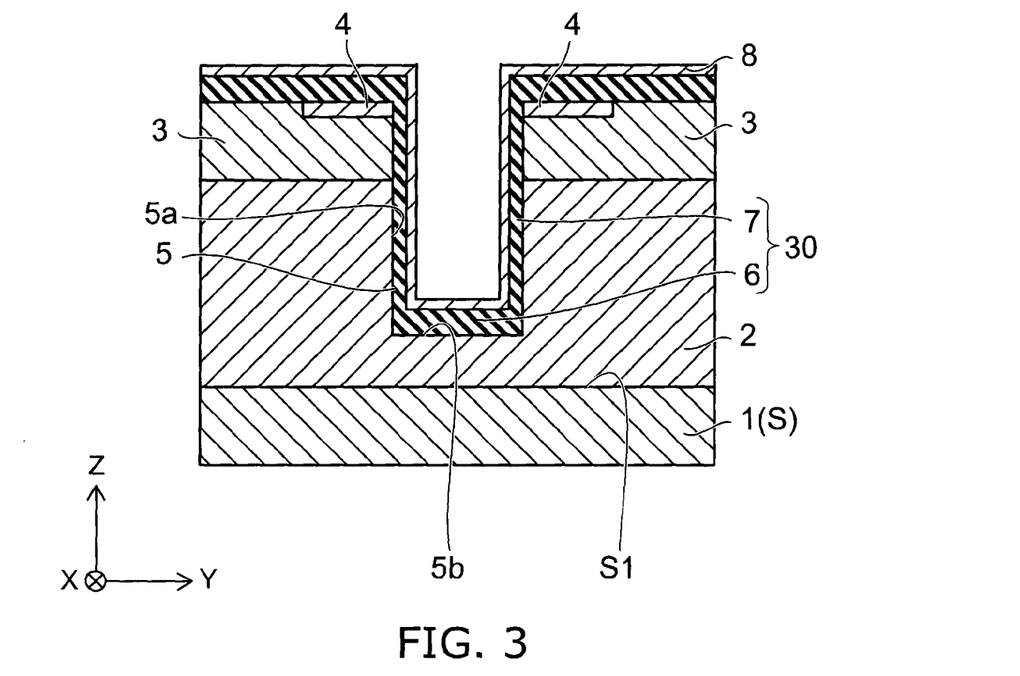
Figure 4:
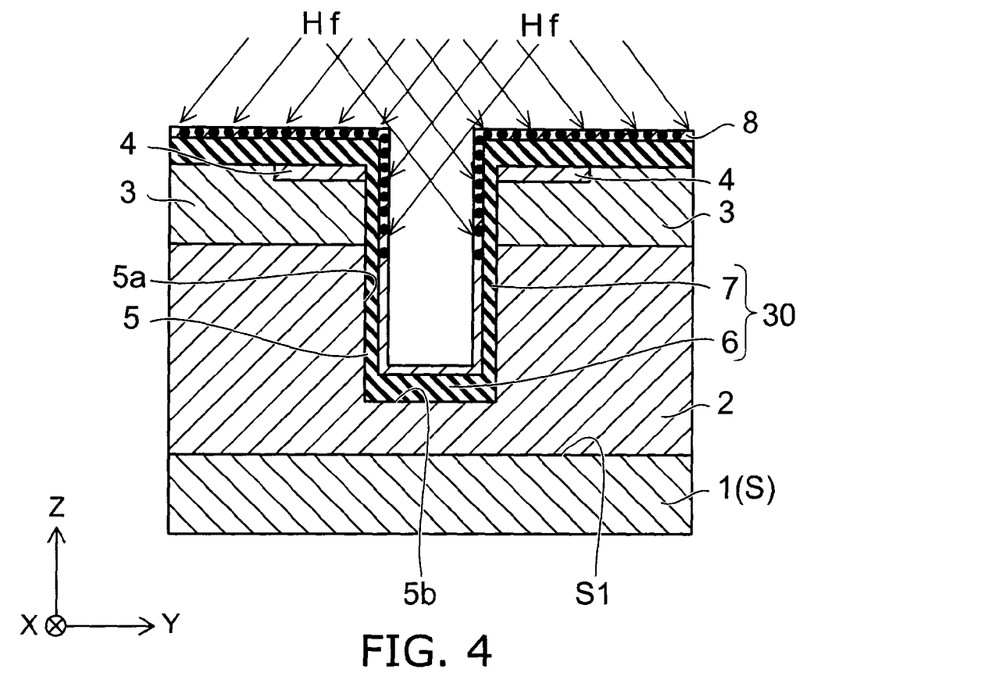

Next, as shown in FIG. 3, polysilicon (polycrystalline silicon) having a film thickness of not less than 30 nm and not more than 100 nm is formed in the trench 5 as the first control electrode portion 8. Then, as shown in FIG. 4, a high-dielectric constant material of, for example, Hf is implanted into the first control electrode portion 8 as a dopant by using inclined-ion implantation. In this case, due to the shadow effect of the side surface 5a of the trench 5, the dopant is implanted little into the first control electrode portion 8 on the lower side of the side surface 5a of the trench 5 and on the side of the bottom surface 5b of the trench 5.

Figure 5:
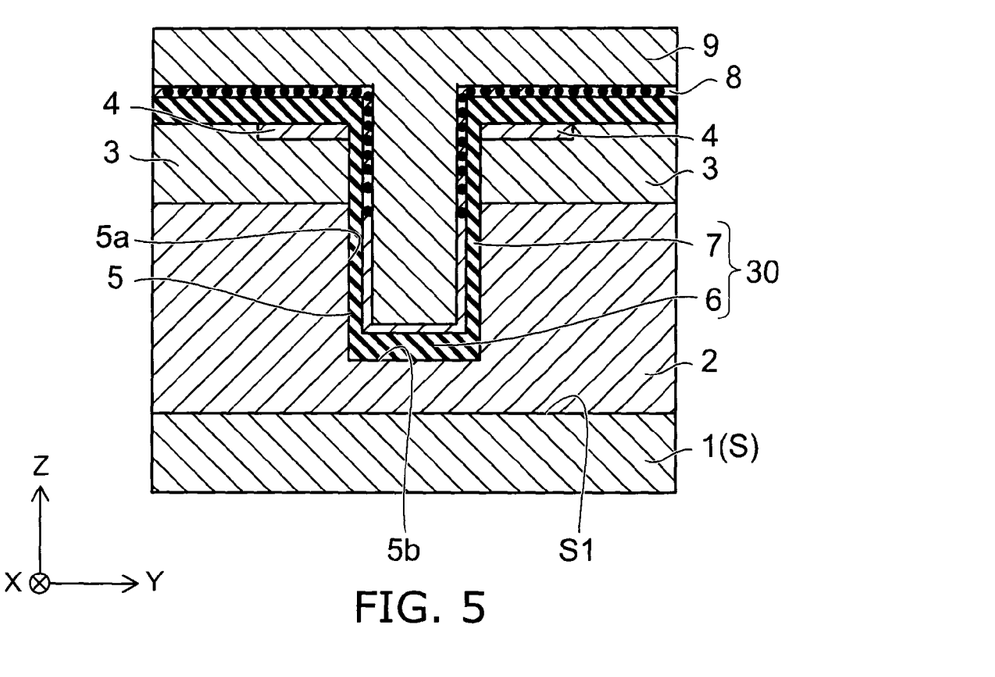
Figure 6:
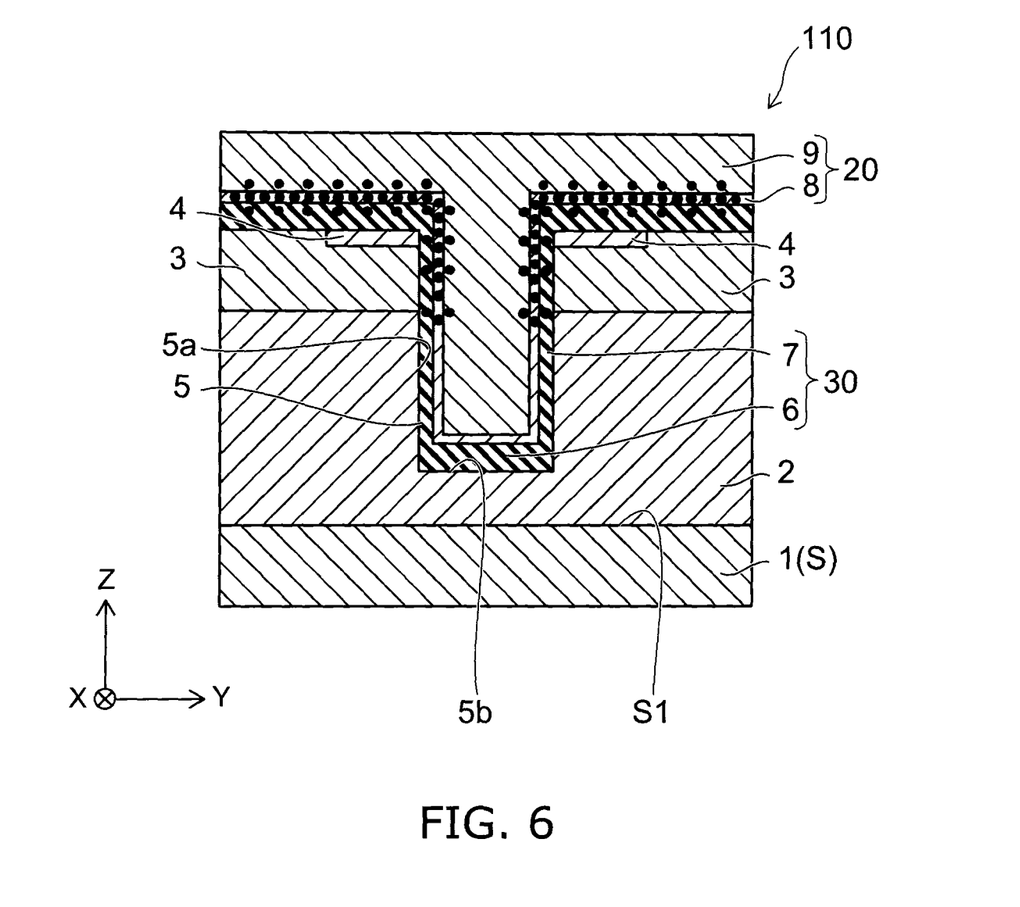

Then, as shown in FIG. 5, polysilicon containing an n type impurity is formed as the second control electrode portion 9 on the first control electrode portion 8 in the trench 5 and subjected to heat treatment at a temperature of about not less than 900° C. and not more than 1100° C. in order to activate the impurity. Due to the heat treatment, as shown in FIG. 6, a portion of the high-dielectric constant material implanted into the first control electrode portion 8 is diffused into the insulating film 30 in contact with it. The insulating film 30 into which the high-dielectric constant material is diffused provides the high-dielectric constant region 7a having a higher effective dielectric constant than the region into the high-dielectric constant material is not diffused.

The high-dielectric constant material may be diffused in a process after the formation of the second control electrode portion 9, for example, in a silicide formation process or a separate thermal process for diffusion may be performed.

Then, by using a publicly known technology, electrode films are formed and patterned to form the first electrode 10 and the second electrode 11 as shown in FIG. 1. In such a manner, the semiconductor device 110 is finished.

In the embodiment, the high-dielectric material is added by inclined ion implantation. In this case, since the shadow effect can be obtained by utilizing the shape of the trench 5, film thicknesses of the gate insulation film 7 and the first control electrode portion 8 are selected taking into account a width of the opening of the trench 5. Then, optimal conditions are applied to diffuse the high-dielectric constant material into the gate insulating film 7 in contact with the third semiconductor region 3, which has a direct influence on improvements in current driving force of the device.

In this manufacturing method, by adding the high-dielectric constant material selectively to the first control electrode portion 8 in contact with a region of the insulating film 30 in the trench 5 which is desired to have a high dielectric constant, for example, at least a portion of the gate insulating film 7 in contact with the side surface 5a of the trench 5 selectively has a high dielectric constant.

The high-dielectric constant material is added from the first control electrode portion 8 to the gate insulating film 7 by utilizing diffusion due to heat treatment, so that when conditions for the heat treatment are optimized, a concentration distribution of the high-dielectric constant material occurs in the gate insulating film 7. That is, the region of the high-dielectric constant region 7a on the side of the control electrode 20 has a higher dielectric constant than the third semiconductor region 3. For example, the film thickness-directional dielectric constant of the high-dielectric constant material 7a decreases gradually from the side of the first control electrode portion 8 as a diffusion source to an interface 3a between the third semiconductor region 3 and the high-dielectric constant region 7a.

Properties such as a binding state of the material at the interface 3a between the insulating film 30 and the third semiconductor region 3 have an influence on the mobility of a channel. In a case where the high-dielectric constant region 7a has the above concentration distribution, the concentration decreases of the high-dielectric constant material distributed in the vicinity of the interface 3a. Therefore, it is considered that a deterioration in channel mobility may be inhibited relatively.

The effective dielectric constant of the gate insulating film 7 in contact with a channel formation region becomes higher than a case where the gate insulating film 7 is made of only silicon oxide, thereby improving the current driving force of the semiconductor device 110.

Although the embodiment has been described using Hf as an example of the high-dielectric constant material, besides it, at least one of the group consisted of Al, Ti, Ta, Zr, Sc, Y, La, and lanthanoid.

Second Embodiment

Figure 7:
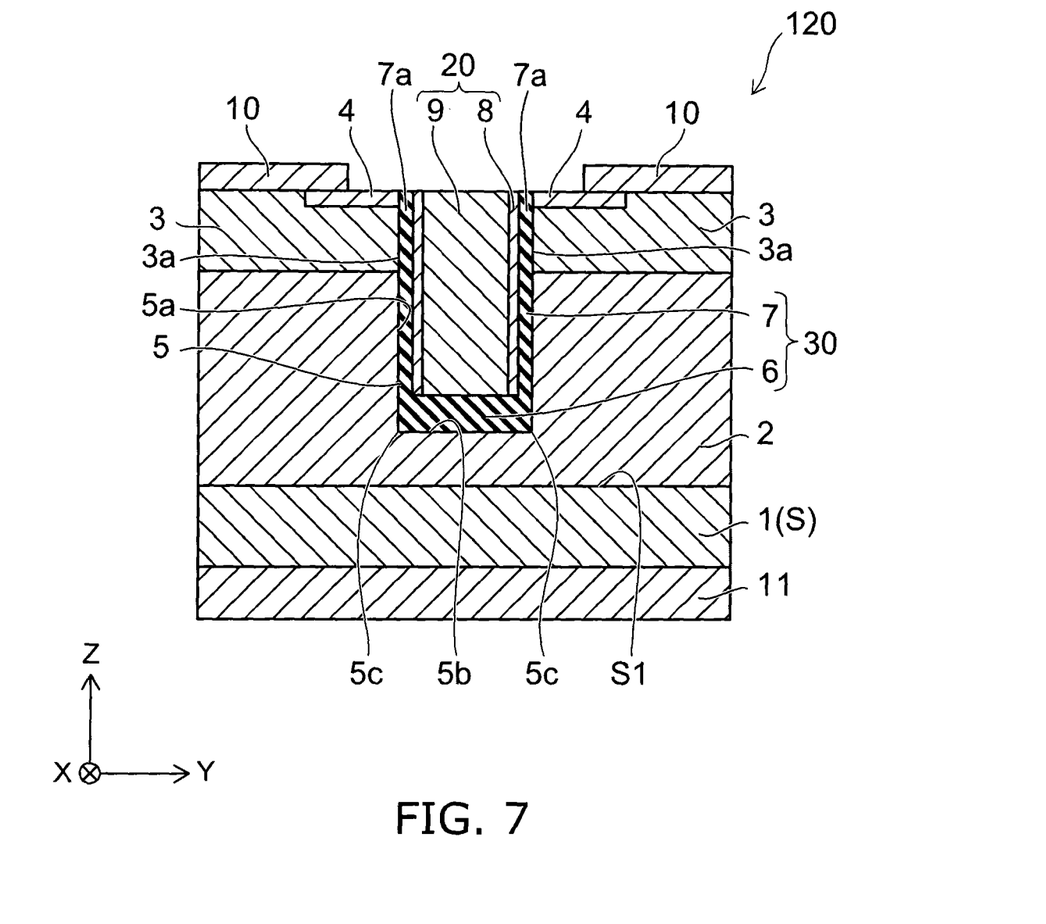
FIG. 7 is a schematic cross-sectional view illustrating a configuration of a semiconductor device according to a second embodiment.

FIG. 7 is a schematic cross-sectional view illustrating a configuration of a semiconductor device according to a second to embodiment.

As shown in FIG. 7, a semiconductor device 120 according to the second embodiment is the same as the semiconductor device 110 according to the first embodiment except for the shape and the forming method of a first control electrode portion 8. Therefore, repetitive description on the same components as those of the first embodiment will be omitted.

In the semiconductor device 120, the first control electrode portion 8 is in contact with a side surface 5a of a trench 5. The first control electrode portion 8 is in contact little with a bottom surface 5b of the trench 5 (slightly in contact with it in some cases).

The first control electrode portion 8 contains a high-dielectric constant material. Further, at least a region of a gate insulating film 7 in contact with a third semiconductor region 3 has a high-dielectric constant region 7a.

In such a semiconductor device 120, the gate insulating film 7 has the high-dielectric constant region 7a, so that the gate insulating film 7 has an increased dielectric constant as compared to a case where the gate insulating layer 7 is made of only silicon oxide. Accordingly, the electric capacitance of the gate insulating film 7 increases to improve the current driving force of the semiconductor device 120. The first control electrode portion 8 containing a high-dielectric material is in contact little with a bottom portion insulating layer 6. Therefore, the high-dielectric material is little diffused into the bottom portion insulating film 6. As a result, a high-quality insulating film having less defects is maintained at the bottom surface 5b, in particular, a corner portion 5c of the trench 5. Accordingly, reliabilities of the semiconductor device 120 are maintained.

Next, a description will be given of a method of manufacturing the semiconductor device 120.

FIGS. 8 to 11 are schematic cross-sectional views illustrating the method of manufacturing the semiconductor device.

Figure 8:
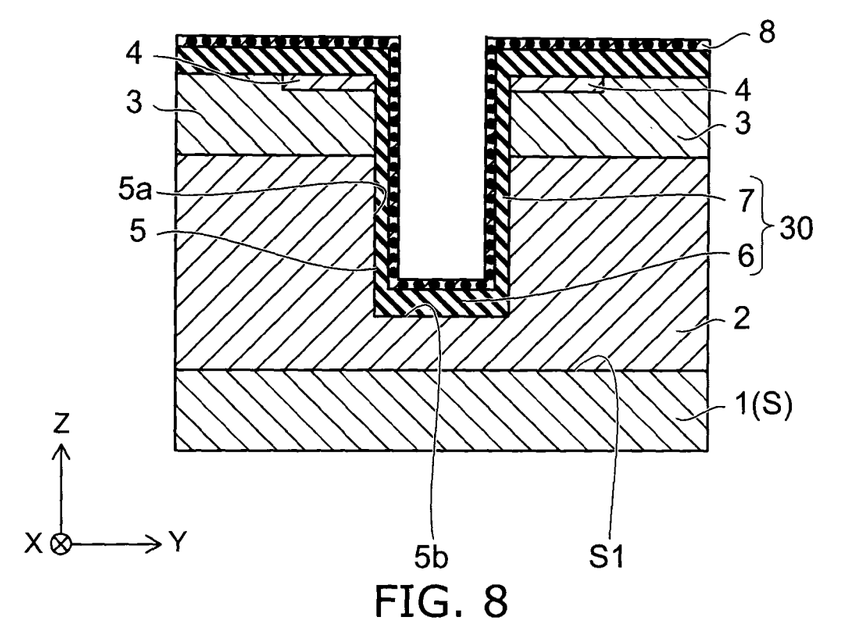
FIGS. 8 to 11 are schematic cross-sectional views illustrating the method of manufacturing the semiconductor device.

First, as shown in FIG. 8, a second semiconductor region 2, a third semiconductor region 3, and a fourth semiconductor region 4 are formed on an upper surface S1 of a substrate S including the first semiconductor region 1 and a trench 5 is formed in the surface, to form an insulating film 30 on it. Those forming processes are the same as those of the first embodiment.

Next, an HfSi film with a film thickness of not less than 5 nm and not more than 20 nm is formed as the first control electrode portion 8. The HfSi film may be formed by PVD such as sputtering by using an HfSi alloy as a target or by solid phase reactions after forming Hf and Si films.

Figure 9:
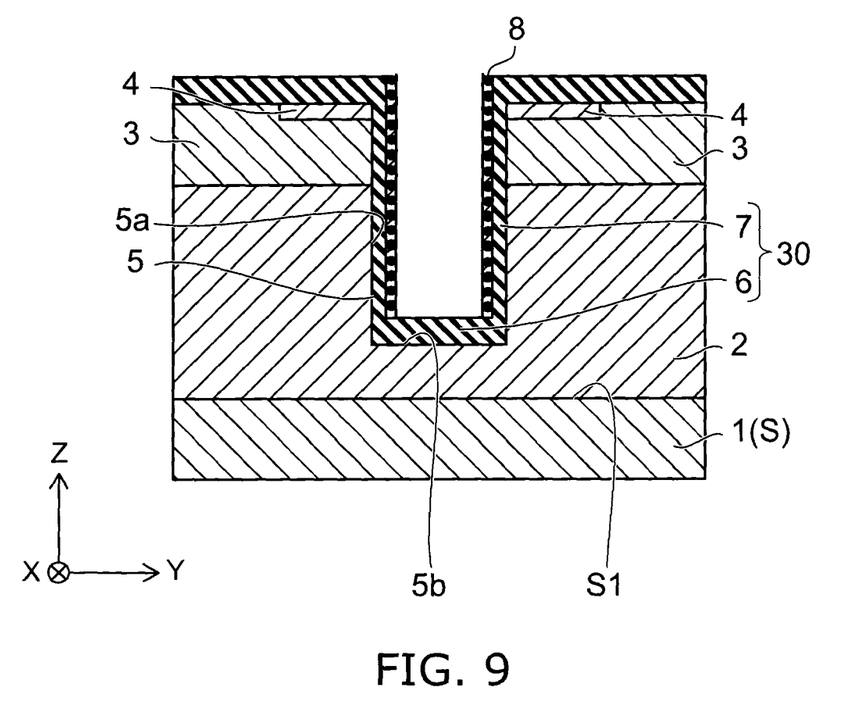

Next, as shown in FIG. 9, anisotropic etching etc. is performed to remove the HfSi film other than the first control electrode portion 8 formed on the side surface 5a of the trench 5. Thus, the first control electrode portion 8 formed on the bottom surface 5b of the trench 5 is removed. In the etching, etching conditions may be selected appropriately to remove a portion of the first control electrode portion 8 formed on the side surface 5a that is close to the bottom surface 5b (portion in contact with the bottom surface 5b).

Figure 10:
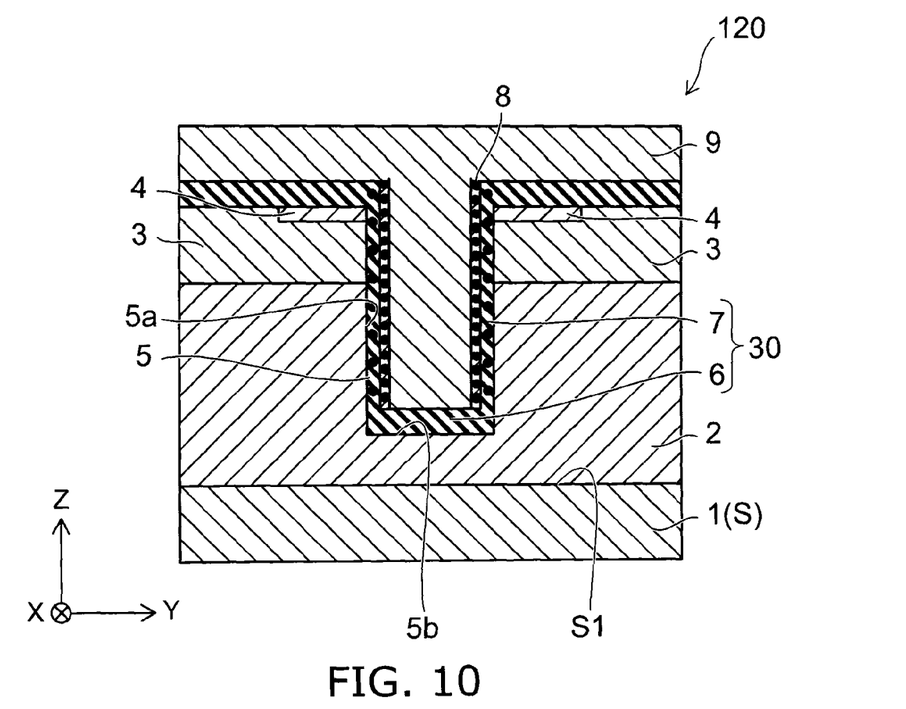

Next, as shown in FIG. 10, polysilicon containing an n type impurity is formed in the trench 5 as a second control electrode portion 9 and subjected to heat treatment at a temperature about not less than 900° C. and not more than 1100° C. to activate the impurity. Due to the heat treatment, a portion of the Hf contained in the first control electrode portion 8 is diffused into the insulating film 30 (gate insulating film 7) in contact with the first control electrode portion 8. As a result, at least a portion of the gate insulating film 7 that is in contact with the third semiconductor region 3 has a high dielectric constant to provide the high-dielectric constant region 7a.

Hf may be diffused in, for example, the silicide formation process performed later than heat treatment for activation of the impurity in the second control electrode portion 9.

Figure 11:
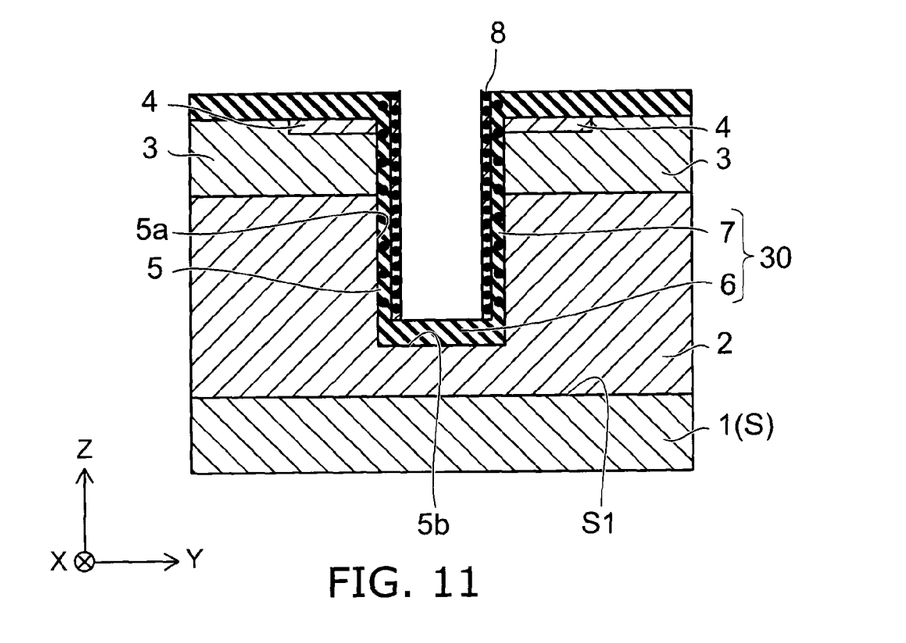

Further, as shown in FIG. 11, Hf may be diffused by heat treatment at a temperature of, for example, about 1000° C. before forming the second control electrode portion 9 after etching the first control electrode portion 8 partially. In this case, preferably the heat treatment is performed under conditions to recover damage that occurred on the bottom portion insulating film 6 at the time of the removal of HfSi.

Further, the heat treatment before forming the second control electrode portion 9 shown in FIG. 10 may be performed in an oxygen atmosphere to diffuse Hf and increase the film thickness of an oxide film of the bottom portion insulating film 6 exposed because HfSi is removed.

If the heat treatment is performed in the oxygen atmosphere, the HfSi surface is oxidized, so that preferably the oxidized surface is removed by wet processing by use of fluorinated acid or ammonium fluoride or isotropic etching. However, in this case, care should be taken not to damage the insulating film at a portion where HfSi is removed. Then, as shown in FIG. 10, polysilicon containing an n type impurity is formed as the second control electrode portion 9 and subjected to heat treatment at a temperature of about not less than 900° C. and not more than 1100° C. in order to activate the impurity.

Then, by forming and patterning the electrode films by using a publicly known technology, the first electrode 10, the second electrode 11, etc. such as shown in FIG. 7 are formed. In such a manner, the semiconductor device 120 is finished.

In this manufacturing method, the first control electrode portion 8 in contact with the bottom surface 5b in the trench 5 is removed, so that the high-dielectric constant material is accurately diffused into the region of the insulating film 30 that is desired to have a high dielectric constant. In such a manner, similar to the first embodiment, the current driving force of the semiconductor device 120 are improved by a distribution of the concentration of the high-dielectric constant material in the high-dielectric constant region 7a and a rise in effective dielectric constant.

At the same time, the high-dielectric constant material is inhibited from being diffused into the bottom portion insulating film 6, to maintain a high-quality insulating film having less defects at the bottom surface 5b of the trench 5. As a result, reliabilities of the semiconductor device 120 are maintained.

Although the embodiment has been described using HfSi as the material of the first control electrode portion 8 containing a high-dielectric constant material, besides it, one elementary metal selected from the group consisted of Al, Hf, Ti, Ta, Zr, Sc, Y, La, and lanthanoid, an alloy containing at least two selected from the group, at least one silicide selected from the group, or at least one nitride selected from the group may be used.

Third Embodiment

Figure 12:
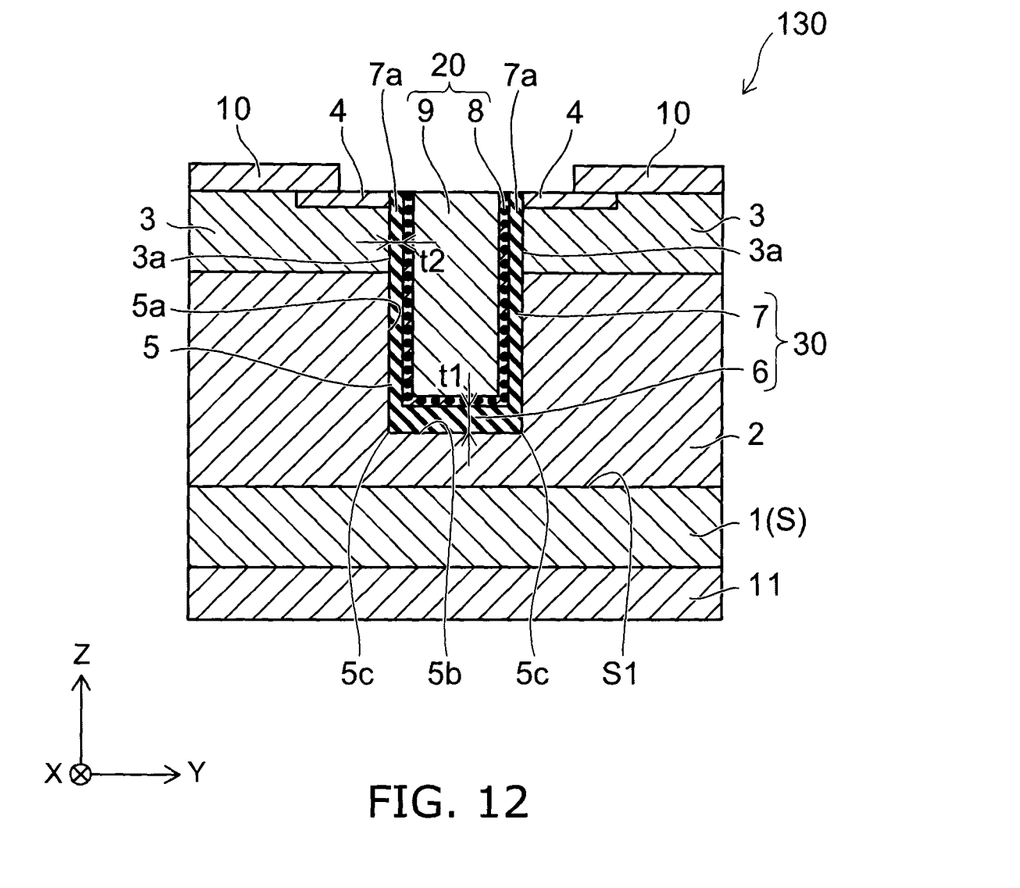
FIG. 12 is a schematic cross-sectional view illustrating a configuration of a semiconductor device according to a third embodiment.

FIG. 12 is a schematic cross-sectional view illustrating a configuration of a semiconductor device according to a third embodiment.

As shown in FIG. 12, a semiconductor device 130 according to the third embodiment is the same as the second embodiment except for the shape of a first control electrode portion 8. Therefore, repetitive description on the same components as those of the second embodiment will be omitted.

In the semiconductor device 130, the first control electrode portion 8 is in contact with a side surface 5a and a bottom surface 5b of a trench 5.

The first control electrode portion 8 contains a high-dielectric constant material. Further, at least a region of a gate insulating film 7 that is in contact with a third semiconductor region 3 is provided with a high-dielectric constant region 7a.

In such a semiconductor device 130, the gate insulating film 7 has the high-dielectric constant region 7a, so that the dielectric constant of the gate insulating film 7 increases as compared to a case where the gate insulating film 7 is made of only silicon oxide. As a result, the electric capacitance of the gate insulating film 7 increases to improve the current driving force of the semiconductor device 130. Although the first control electrode portion 8 is in contact with a bottom portion insulating film 6, a good quality insulating film having less defects is maintained on the bottom surface 5b of the trench 5 by increasing a film thickness t1 of the bottom portion insulating film 6 as compared to, for example, the semiconductor device 110 according to the first embodiment. As a result, reliabilities of the semiconductor device 130 are maintained.

Next, a description will be given of a method of manufacturing the semiconductor device 130.

Figure 13:
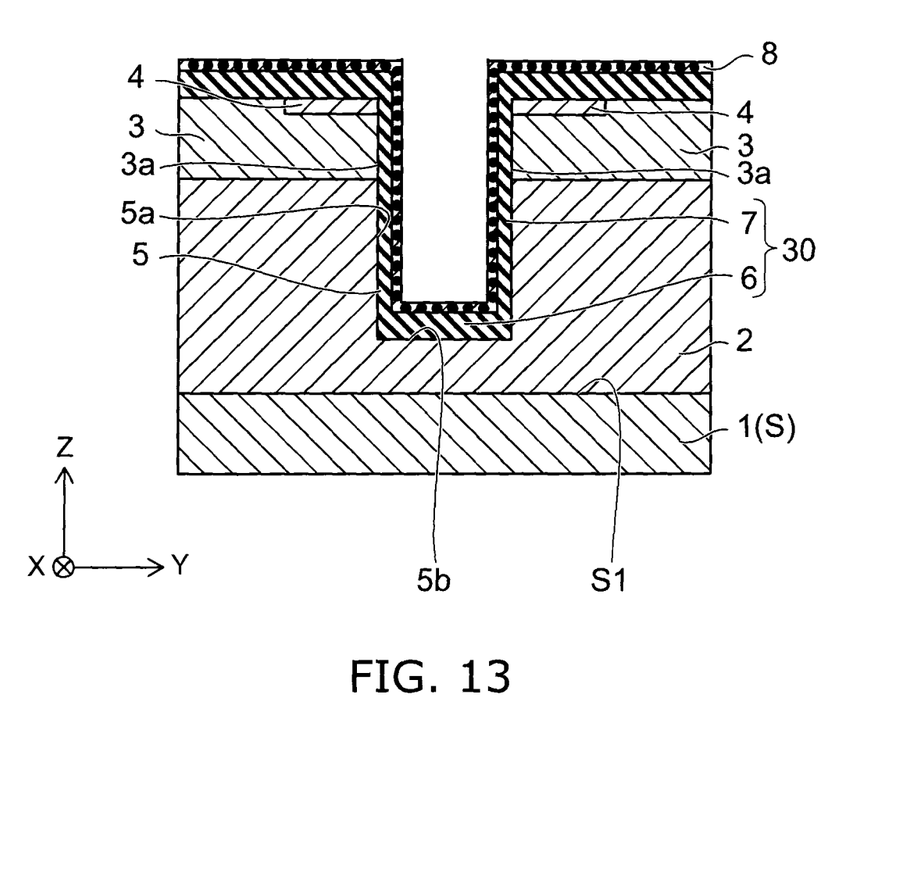
FIGS. 13 and 14 are schematic cross-sectional views illustrating the semiconductor device manufacturing method.
Figure 14:
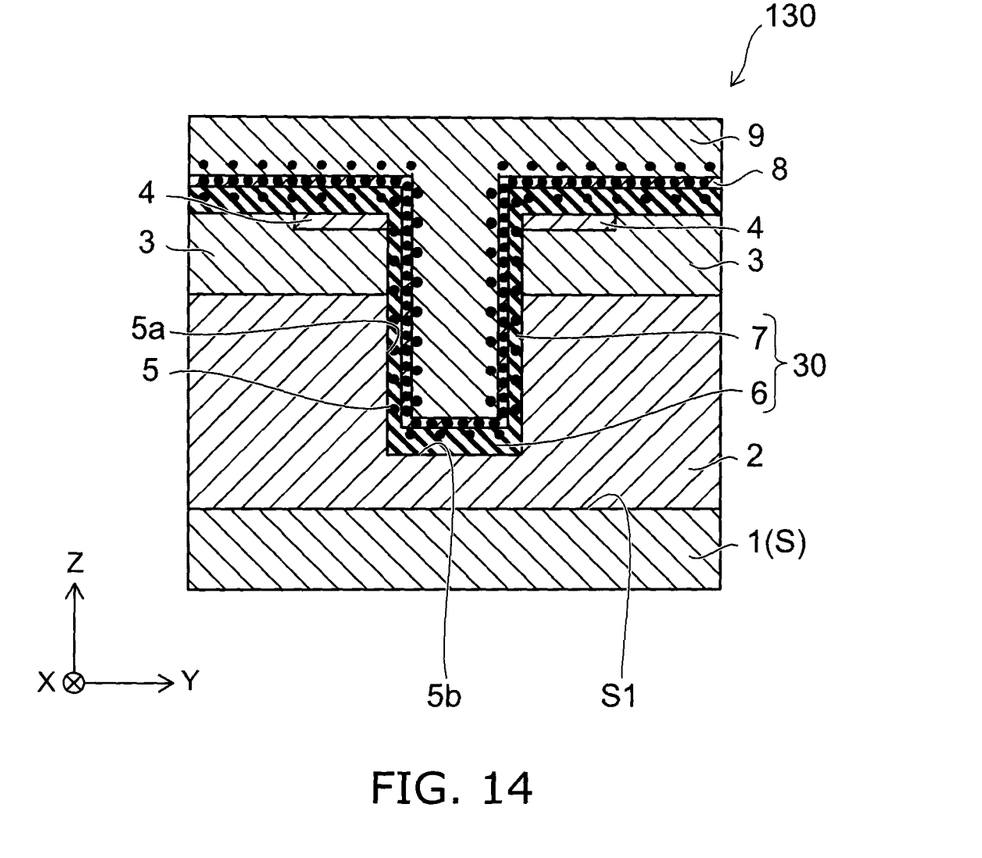

FIGS. 13 and 14 are schematic cross-sectional views illustrating the semiconductor device manufacturing method.

First, as shown in FIG. 13, a second semiconductor region 2, a third semiconductor region 3, and a fourth semiconductor region 4 are formed on an upper surface S1 of a substrate S including the first semiconductor region 1 and a trench 5 is formed in the surface, to form an insulating film 30 on it. Those forming processes are the same as those of the second embodiment.

Next, an HfSi film with a film thickness of not less than about 5 nm and not more than 20 nm is formed as the first control electrode portion 8. The HfSi film may be formed by PVD such as sputtering by using an HfSi alloy as a target or by solid phase reactions after forming Hf and Si films.

Next, as shown in FIG. 14, polysilicon containing an n type impurity is formed as a second control electrode portion 9 and subjected to heat treatment at a temperature about not less than 900° C. and not more than 1100° C. to activate the impurity. Due to the heat treatment, a portion of the Hf contained in the first control electrode portion 8 is diffused into the insulating film 30 in contact with the first control electrode portion 8. As a result, the insulating film 30 has a higher dielectric constant. As a result of the diffusion, at least a portion of the gate insulating film 7 that is in contact with the third semiconductor region 3 provides the high-dielectric constant region 7a.

Hf may be diffused in a later process, for example, a silicide formation process or a separate thermal process for diffusion may be performed.

Further, Hf may be diffused by heat treatment at a temperature of, for example, about 1000° C. before forming the second control electrode portion 9.

Then, by forming and patterning the electrode films by using a publicly known technology, the first electrode 10, the second electrode 11, etc. such as shown in FIG. 12 are formed. In such a manner, the semiconductor device 130 is finished.

The semiconductor device 130 has a construction such that the first control electrode portion 8 may be left on the side surface 5a and the bottom surface 5b of the trench 5. As described above, the bottom surface 5b of the trench 5 is subject to electric field concentration, so that the insulating film is desired to have high reliabilities. In the semiconductor device 130, the high-dielectric constant material is diffused also into the bottom surface insulating film 6, so that it is important to avoid the resultant deterioration in reliabilities. Therefore, it is preferable to sufficiently increase, for example, the bottom surface insulating film 6.

This manufacturing method improves the current driving force and maintains the reliabilities of the semiconductor device 130 equally to the semiconductor devices 110 and 120. Further, in contrast to the method of manufacturing the semiconductor device 120 according to the second embodiment, the portion of the first control electrode portion 8 need not be etched after it is formed, so that the manufacturing processes are simplified.

Although the embodiment has been described using HfSi as the material of the first control electrode portion 8 containing a high-dielectric constant material, besides it, one elementary metal selected from the group consisted of Al, Hf, Ti, Ta, Zr, Sc, Y, La, and lanthanoid, an alloy containing at least two selected from the group, at least one silicide selected from the group, or at least one nitride selected from the group may be used.

As described hereinabove, the semiconductor device and the method for manufacturing the same according to the embodiment can maintain reliabilities for high electric fields and realize higher performance.

Although the embodiments and the variants have been described, the invention is not limited to those examples. For example, appropriate additions, deletions, and design modifications of the components of the above embodiments and variants as well as appropriate combinations of their features by those skilled in the art are covered by the scope of the invention as long as they include the gist of the invention.

For example, although the above embodiments and variants have been described on the assumption that the first conductivity type is n and the second conductivity type is p, the invention can be carried out also if the first conductivity type is assumed to be p and the second conductivity type is assumed to be n. Further, although the above embodiments have been described by assuming an n type MOSFET using electrons as its carrier, it is also possible to form the construction of the above embodiments on a substrate containing a p type impurity and apply it to an n type IGBT. Further, the above embodiments can be applied also to a p type MOSFET and a p type IGBT that use holes as the carrier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device manufacturing method comprising:
    forming a second semiconductor region containing silicon carbide of a first conductivity type on a first semiconductor region, the first semiconductor region containing silicon carbide;
    forming a third semiconductor region containing silicon carbide of a second conductivity type on the second semiconductor region;
    forming a fourth semiconductor region containing silicon carbide of the first conductivity type on the third semiconductor region;
    forming a trench in the fourth semiconductor region, the third semiconductor region, and the second semiconductor region;
    forming an insulating film on a side surface and a bottom surface of the trench;
    forming a first control electrode portion contacting with the insulating film, the first control electrode portion including a contacting region being in contact with at least the third semiconductor region;
    adding a material in the contacting region in the trench, the material being such that a dielectric constant of a compound of an oxide or nitride of the material is higher than a dielectric constant of silicon oxide; and
    forming a high-dielectric constant region in a region of the insulating film that is in contact with at least the third semiconductor region by diffusing the material.

2. The method according to claim 1, wherein the adding the material includes performing inclined-ion implantation of the material into the first control electrode portion in the trench from an opening of the trench.

3. The method according to claim 1, further comprising forming the second control electrode portion on the first control electrode portion in the trench after the adding the material.

4. The method according to claim 1, wherein a film thickness of a portion of the insulating film between a bottom surface of the trench and the second semiconductor region is larger than a film thickness of a portion of the insulating film between a side surface of the trench and the third semiconductor region.

5. The method according to claim 1, wherein the material includes at least one selected from the group consisted of Al, Hf, Ti, Ta, Zr, Sc, Y, La, and lanthanoid.

6. A semiconductor device manufacturing method comprising:
   forming a second semiconductor region containing silicon carbide of a first conductivity type on a first semiconductor region, the first semiconductor region containing silicon carbide;
   forming a third semiconductor region containing silicon carbide of a second conductivity type on the second semiconductor region;
   forming a fourth semiconductor region containing silicon carbide of the first conductivity type on the third semiconductor region;
   forming a trench in the fourth semiconductor region, the third semiconductor region, and the second semiconductor region;
   forming an insulating film on a side surface and a bottom surface of the trench;
   forming a first control electrode portion containing a material, the material being such that a dielectric constant of a compound of an oxide or nitride of the material is higher than a dielectric constant of silicon oxide, the first control electrode contacting with the insulating film;
   forming a second control electrode portion on the first control electrode portion; and
   forming a high-dielectric constant region in a region of the insulating film, the region contacting with at least the third semiconductor region by diffusing the material.

7. The method according to claim 6, wherein the formation of the first control electrode portion includes removing a portion of the first control electrode portion on the side of the bottom surface of the trench.

8. The method according to claim 6, wherein the formation of the first control electrode portion includes increasing, by oxidization, the film thickness of the insulating film exposed by removing a portion of the first control electrode portion on the side of the bottom surface of the trench.

9. The method according to claim 6, wherein the material includes one elementary metal selected from the group consisted of Al, Hf, Ti, Ta, Zr, Sc, Y, La, and lanthanoid, or an alloy containing at least two selected from the group, at least one silicide selected from the group, or at least one nitride selected from this group.

* * * * *